(12) United States Patent
Wochner et al.

(10) Patent No.: US 9,266,741 B2
(45) Date of Patent: Feb. 23, 2016

(54) POLYCRYSTALLINE SILICON CHUNKS AND METHOD FOR PRODUCING THEM

(71) Applicant: Wacker Chemie AG, Munich (DE)

(72) Inventors: Hanns Wochner, Burghausen (DE); Laszlo Fabry, Burghausen (DE)

(73) Assignee: Wacker Chemie AG, Munich (DE)

( * ) Notice: Subject to any disclaimer, the term of this patent is extended or adjusted under 35 U.S.C. 154(b) by 308 days.

(21) Appl. No.: 13/952,050

(22) Filed: Jul. 26, 2013

(65) Prior Publication Data

US 2014/0037959 A1    Feb. 6, 2014

(30) Foreign Application Priority Data

Aug. 6, 2012 (DE) .......................... 10 2012 213 869

(51) Int. Cl.
| | |
|---|---|
| *C01B 33/00* | (2006.01) |
| *C01B 33/037* | (2006.01) |
| *C22C 29/08* | (2006.01) |
| *B02C 19/00* | (2006.01) |
| *B02C 4/30* | (2006.01) |
| *C30B 29/06* | (2006.01) |
| *C01B 33/02* | (2006.01) |
| *C22C 38/00* | (2006.01) |
| *C30B 35/00* | (2006.01) |

(52) U.S. Cl.
CPC .............. *C01B 33/037* (2013.01); *B02C 4/305* (2013.01); *B02C 19/0056* (2013.01); *C01B 33/02* (2013.01); *C22C 29/08* (2013.01); *C22C 38/00* (2013.01); *C30B 29/06* (2013.01); *C30B 35/007* (2013.01); *Y10T 428/2982* (2015.01)

(58) Field of Classification Search
None
See application file for complete search history.

(56) References Cited

U.S. PATENT DOCUMENTS

| | | | | |
|---|---|---|---|---|
| 4,588,571 | A | * 5/1986 | Bildl et al. ...................... 423/348 |
| 4,923,512 | A |   5/1990 | Timm et al. |
| 4,971,654 | A | * 11/1990 | Schnegg et al. ............... 438/752 |
| 5,436,164 | A |   7/1995 | Dumler et al. |
| 5,851,303 | A |   12/1998 | Hwang et al. |
| 6,004,402 | A | * 12/1999 | Cercone et al. .................... 134/2 |
| 6,375,011 | B1 |   4/2002 | Flottmann et al. |
| 7,270,706 | B2 |   9/2007 | Andrejewski et al. |
| 7,549,600 | B2 |   6/2009 | Hesse et al. |
| 7,950,600 | B2 |   5/2011 | Gruebl et al. |
| 2002/0108681 | A1 |   8/2002 | Ishii et al. |
| 2006/0070569 | A1 |   4/2006 | Andrejewski |
| 2006/0079033 | A1 |   4/2006 | Machida et al. |
| 2007/0235574 | A1 |   10/2007 | Schaefer et al. |
| 2009/0130014 | A1 |   5/2009 | Fukuyama et al. |
| 2010/0001106 | A1 |   1/2010 | Schaefer |
| 2010/0098506 | A1 |   4/2010 | Tanaka |
| 2010/0154357 | A1 |   6/2010 | Wochner |
| 2012/0052297 | A1 |   3/2012 | Pech |
| 2013/0216466 | A1 | * 8/2013 | Traunspurger et al. ....... 423/348 |

FOREIGN PATENT DOCUMENTS

| | | | |
|---|---|---|---|
| CN | 101218176 | A | 7/2008 |
| CN | 102134077 | * | 7/2011 |
| DE | 4137521 | A1 | 5/1992 |
| DE | 102006035081 | A1 | 1/2008 |
| DE | 102007027110 | A1 | 12/2008 |
| DE | 102007039638 | A1 | 2/2009 |
| DE | 10124393 | B4 | 2/2013 |
| EP | 0345618 | A2 | 12/1989 |
| EP | 539097 | * | 4/1993 |
| EP | 1043249 | B1 | 11/2001 |
| EP | 1942077 | A1 | 7/2008 |
| EP | 2423163 | A1 | 2/2012 |
| JP | 2006122902 | A | 5/2006 |
| JP | 2009544564 | A | 12/2009 |
| TW | I280623 | B | 8/1994 |

OTHER PUBLICATIONS

PatBase abstract for DE 10 2007 039 638 A1.
Mukhopadhyay et al. "Recent developments on WC-based bulk composites", J Mater Sci, vol. 46, pp. 571-589 (2011).

* cited by examiner

*Primary Examiner* — Steven Bos
(74) *Attorney, Agent, or Firm* — Caesar Rivise, PC

(57) ABSTRACT

The present invention relates to polycrystalline silicon chunks which are cubic and have a metal content of less than 200 pptw and a dopant content of less than 50 ppta. Methods for producing polycrystalline silicon chunks, include the steps of providing a polycrystalline silicon rod, comminuting the polycrystalline silicon rod into cubic chunks, and cleaning the polycrystalline silicon chunks, wherein comminution takes place using a spiked-roll crusher having at least one spiked roll, the spiked roll including $W_2C$ phases or WC phases with 0.1-10% of a metal carbide selected from the group consisting of titanium carbide, chromium carbide, molybdenum carbide, vanadium carbide, and nickel carbide or consisting of steel with 1-25% W.

3 Claims, No Drawings

POLYCRYSTALLINE SILICON CHUNKS AND METHOD FOR PRODUCING THEM

BACKGROUND OF THE INVENTION

The invention relates to polycrystalline silicon chunks and to methods for producing them.

Polycrystalline silicon serves as starting material for the production of electronic components and solar cells.

It is obtained by thermal decomposition of a silicon-containing gas or of a silicon-containing gas mixture. This process is identified as deposition from the vapor phase (CVD, chemical vapor deposition). On the large scale, this process is realized in reactors called Siemens reactors. The polysilicon here is produced in the form of rods.

The polysilicon rods are uninstalled from the reactor and comminuted by means of manual methods or mechanically. The coarse-chunk polysilicon this produces is comminuted further, using crushers, to give polycrystalline silicon fragments. A suitable crusher, namely a roll crusher, is known from U.S. Pat. No. 7,950,600 B2. The claimed roll crusher comprises a roll which rotates with a shaft and comminutes polycrystalline silicon, said roll consisting of a steel carrier roll and a plurality of hard-metal segments, the hard-metal segments consisting of a cobalt matrix in which tungsten carbide is incorporated, and the hard-metal segments being fastened reversibly with a form fit on the carrier roll.

Following comminution, the chunk polysilicon is typically classified or sorted by a mechanical screening method or by means of optical sorting.

US 2007/0235574 A1 discloses a device for comminuting and sorting polycrystalline silicon, comprising a facility for feeding coarse-chunk polysilicon into a crusher unit, the crusher unit, and a sorting unit for classifying the chunk polysilicon, characterized in that the device is provided with a controller which allows variable adjustment of at least one crushing parameter in the crusher unit and/or of at least one sorting parameter in the sorting unit.

The crusher unit comprises roll crushers or jaw crushers, preferably spiked roll crushers.

By means of the method it is possible specifically to produce cubic chunk polysilicon with a size of 45 to 250 mm that is no longer flowable, and to do so reproducibly and with a high yield.

By using profiled rolls such as spike rolls, a cubic polysilicon chunk is formed that has a size of 45 to 250 mm, with the ratio of the weight of a chunk and the maximum length of a chunk being ≥3 g/mm on average over all the chunks.

US 2010/0001106 A1 discloses a method for producing high-purity classified chunk polysilicon by comminuting and classifying polysilicon from the Siemens process, using a device comprising comminuting tools and a screening device, and cleaning the resultant chunk polysilicon by means of a cleaning bath, characterized in that the comminuting tools and the screening device consistently possess a surface that comes into contact with the polysilicon and that comprises a material which contaminates the chunk polysilicon only with extraneous particles which can be subsequently removed selectively by the cleaning bath.

Comminution takes place in a crushing unit which comprises a roll crusher or a jaw crusher, preferably a spiked-roll crusher.

Advantages are promised by this method especially when comminuting tools and screening device have a surface made of low-alloy steel.

By use of spiked-roll crushers, cubic polycrystalline silicon chunks are obtained. Metallic impurities can be lowered to a low level through use of comminuting tools made from low-contamination materials such as tungsten carbide.

Nevertheless, low-contamination materials cannot be used for all parts of the units—crushing shells with spikes are stated explicitly. In view of its high brittleness and low toughness, low-abrasion tungsten carbide is not very suitable for use for profiled rolls.

If low-abrasion tungsten carbide is used, as ought to be possible only in the case of smooth rolls, the resulting chunk is non-cubic and has increased tungsten levels, which is a disadvantage.

U.S. Pat. No. 7,270,706 B2, however, discloses a profiled roll having teeth disposed around the circumference of the roll, a shaft on which the roll is rotatably mounted, a housing having surfaces defining a cavity inside which the roll is disposed and/or fastened, an inlet port on top of the housing, an exit port on the bottom of the housing, a plate inside the housing opposite the roll, where the roll, teeth, plate, and housing surfaces defining the cavity are produced from or coated with a material that minimizes contamination of polycrystalline silicon. The material is preferably selected from the group consisting of carbides, cermets, ceramics, and combinations thereof. Particularly preferred is the use of a material selected from the group consisting of tungsten carbide, tungsten carbide with a cobalt binder, tungsten carbide with a nickel binder, titanium carbide, $Cr_3C_2$, $Cr_3C_2$ with nickel-chromium alloy binder, tantalum carbide, niobium carbide, silicon nitride, silicon carbide in a matrix, such as Fe, Ni, Al, Ti, or Mg, for example, aluminum nitride, tantalum carbide, niobium carbide, titanium carbide with cobalt carbonitride and titanium carbonitride, nickel, nickel-cobalt alloy, iron, and combinations thereof.

It has been found that for a profiled roll made of tungsten carbide or tungsten carbide with a cobalt binder or tungsten carbide with a nickel binder it is impossible to attain high durability. After comminution of just 100 metric tons of silicon, teeth break off from the roll. Accordingly, in order to be able to continue producing cubic polysilicon chunk, the rolls must be replaced, which is expensive and therefore disadvantageous. It would be desirable to be able to comminute at least 1000 metric tons of silicon before the roll becomes unusable, in order to allow economic production of cubic polycrystalline silicon chunk by low-contamination tooling.

If steel rolls, made from low-alloy steel, for example, are used instead of rolls made from low-contamination material, the result is increased instances of metal contamination. This makes subsequent cleaning unavoidable.

The cleaning method of US 2010/0001106 A1 provides a preliminary cleaning procedure in at least one stage with an oxidizing cleaning solution comprising the compounds hydrofluoric acid, hydrochloric acid, and hydrogen peroxide, a main cleaning procedure in a further stage with a cleaning solution which comprises nitric acid and hydrofluoric acid, and a hydrophilization of the chunk polysilicon by means of a further stage with an oxidizing cleaning solution.

U.S. Pat. No. 7,270,706 B2 as well proposes corresponding, optional cleaning methods.

Such cleaning methods allow the instances of metal contamination on the surface to be reduced.

However, not all metals are readily soluble in the mineral acids used. It has emerged that tungsten—when tungsten carbide is used as roll material, the material becomes contaminated with tungsten—cannot be removed satisfactorily, because tungsten is not readily soluble in the mineral acids.

It has emerged, moreover, that the concentrations of dopant in the polysilicon chunks produced by the two methods described above are high: specifically, at least 100 ppta (dopants boron, phosphorus, and arsenic in total).

Arising from this problem scenario is a first objective of the invention. A further goal is to lower the acquisition costs for the cleaning unit by 25%, and the acid and disposal costs likewise by 25%, relative to the existing methods.

DESCRIPTION OF THE INVENTION

The object is achieved by means of polycrystalline silicon chunks which are cubic and on their surfaces have a metal content of less than 200 pptw and a dopant content of less than 50 ppta.

The cubicity of the polycrystalline silicon chunks is determined in accordance with DIN EN 933-4. In this method a particle morphology gage is used to determine the length-to-thickness ratio of the granular material.

Cubic chunk is defined as follows:
Length/thickness >3 is a noncubic chunk.
Length/thickness <3 is a cubic chunk.

In other words, for cubic chunk, the ratio between the longest and shortest dimensions of a chunk must be less than 3.

When charging a crucible with polychunk, the cubicity of the polychunk affects the amount which can be charged to a crucible. With a cubic chunk, the amount which can be charged is around 5% to 10% more, which is an advantage.

The polycrystalline silicon chunks preferably have a concentration of metals on the surface of 10-200 pptw, more preferably 10-100 pptw. As a result, the polysilicon is purified polysilicon.

The metals comprise Fe, Cr, Ni, Na, Zn, Al, Cu, Mo, Ti, W, K, Co, Mn, Ca, Mg, V, and Ag. The figures stated for the surface metals relate to these metals in total.

Preferably the surface contamination with Fe is 1-40 pptw, with Cr 0.1-5 pptw, with Cu 0.1-5 pptw, with Na 1-30 pptw, with Ni 0.1-5 pptw, with Zn 0.1-10 pptw, with Ti 0.1-10 pptw, and with W 0.1-15 pptw.

The surface concentration of tungsten on the polycrystalline silicon chunks is preferably 0.1-10 pptw, more preferably 0.1-5 pptw.

The surface metals are determined for the purposes of the invention in accordance with ASTM F 1724-96 by chemical detachment of the silicon surface and subsequent analysis of the detached solution by means of ICPMS (inductively coupled plasma mass spectrometry).

The polycrystalline silicon chunks are distinguished by low dopant content on their surfaces.

Dopants are boron, phosphorus, and arsenic.

The polycrystalline silicon chunks have a dopant concentration of 1-50 ppta on the surface. This relates to the concentration of boron, phosphorus, and arsenic in total.

The concentration of boron on the surface is preferably 1-20 ppta, more preferably 1-10 ppta.

The concentration of phosphorus on the surface is preferably 1-20 ppta, more preferably 1-10 ppta.

Surface contamination with arsenic is preferably 0.01-10 ppta, more preferably 0.01-5 ppta, very preferably 0.01-2 ppta.

The surface dopant contaminations of polycrystalline silicon can be determined by taking two polycrystalline silicon rods produced by deposition in a Siemens reactor and analyzing one rod directly after deposition for dopant contaminations (bulk and surface), while the second rod passes through the units in which the rod is further-processed and, after having passed through the units, is likewise analyzed for dopant contaminations (bulk and surface). Since both rods can be considered to have the same level of bulk contaminations, the difference in the two levels of contamination ascertained gives the surface contamination caused by the further-processing steps such as comminuting, cleaning, transporting, and packing. This can be ensured at least when rod and brother rod have been deposited on one and the same U-shaped support body.

An alternative possibility is to use the method described in DE 41 37 521 A1. For that method, small chunks produced from a polycrystalline silicon rod are introduced into a silicon vessel and processed with the silicon vessel to give a single crystal. In that case, however, the concentrations in the bulk and the contamination of the silicon vessel must be subtracted from the overall contaminations ascertained.

For the purposes of the invention, dopants (B, P, As, Al) are analyzed by photoluminescence in accordance with SEMI MF 1398 on an FZ single crystal (SEMI MF 1723) produced from the polycrystalline material.

From the monocrystalline rod produced by FZ from a polycrystalline silicon rod or from polycrystalline silicon chunks, a wafer is separated off, etched with HF/HNO3, rinsed with 18 MΩ water, and dried. The photoluminescence measurements are performed on this wafer.

The object of the invention is also achieved by a first method for producing polycrystalline silicon chunks, comprising providing a polycrystalline silicon rod, comminuting the polycrystalline silicon rod into cubic chunks, and cleaning the polycrystalline silicon chunks, characterized in that comminution takes place using a spiked-roll crusher having at least one spiked roll, the at least one spiked roll comprising $W_2C$ phases or comprising WC phases and also 0.1-10% of a metal carbide selected from the group consisting of titanium carbide, chromium carbide, molybdenum carbide, vanadium carbide, and nickel carbide.

A spiked-roll crusher of this kind has low brittleness and high toughness. The material is not a low-abrasion material, and so in the course of comminution there is contamination of silicon. It has been found, however, that the contaminations can easily be removed by cleaning.

These properties are also possessed by steel spiked rolls if the steel contains 1-25% W.

The object of the invention is therefore also achieved by a second method for producing polycrystalline silicon chunks, comprising providing a polycrystalline silicon rod, comminuting the polycrystalline silicon rod into cubic chunks, and cleaning the polycrystalline silicon chunks, where comminution takes place using a spiked-roll crusher having at least one spiked roll, the at least one spiked roll consisting of steel with 1-25% W.

There is preferably 1-15% W in the steel.

In one preferred embodiment of this second method, the cleaning of the polycrystalline silicon chunks takes place with preliminary cleaning in an alkaline solution. The alkaline solution preferably comprises NaOH or KOH.

Through the use of spiked rolls, both methods of the invention lead to a cubic polysilicon chunk.

A preferred embodiment of the first method of the invention is elucidated in detail below.

A polysilicon rod is comminuted with comminuting machines on the basis of nonbrittle WC grades that are soluble in mineral acids.

The nonbrittle WC grades allow the use of spiked rolls and hence the production of a cubic polychunk.

A polychunk produced in this way has an iron and tungsten entry level of <10 ppbw.

The nonbrittle WC grades are based on WC and $W_2C$ phases.

Tungsten carbide based on $W_2C$ phases is soluble in $HF/HNO_3$.

Binder used is preferably cobalt with a fraction of 0.1% up to a maximum of 20%.

The spiked roll preferably comprises 80-99.9% $W_2C$ and 0.1-20% cobalt.

With tungsten carbide grades based on WC phases, the acid solubility and the abrasion are increased by selective additions of further metal carbides in the range from 0.1% to 10%, such as titanium carbides, chromium carbides, molybdenum carbides, vanadium carbides, and nickel carbides.

The spiked roll preferably comprises 70-99.8% WC, 0.1-20% cobalt, and 0.1-10% a metal carbide selected from the group consisting of titanium carbide, chromium carbide, molybdenum carbide, vanadium carbide, and nickel carbide.

Additions of nickel carbide and chromium carbide are used with preference since they promote the acid solubility.

The particle size of the WC and/or $W_2C$ particles as well has an influence on the abrasion and the acid solubility. From the publication "Recent developments on WC-based bulk composites", Journal of Materials Science JMS 46: 571-589 (2011) it is known that a reduction in the particle size results in a higher Vickers hardness on the part of the tungsten carbide at room temperature. Accordingly, spiked rolls with small particle sizes tend to exhibit lower abrasion. Nevertheless, the acid solubility deteriorates in the case of reduced particle sizes. These are mutually opposed effects. For the purposes of this invention, increased abrasion is accepted, since it has emerged that the tungsten carbide types used ($W_2C$, WC with additions) are readily removable.

The procedure for cleaning is preferably as follows:

The preliminary cleaning and the main cleaning take place in separate acid circuits Preliminary cleaning in HF, HCl, and $H_2O_2$, e.g., for 5 minutes in a mixture of HF 5 weight %, HCl 8 weight %, $H_2O_2$ 3 weight %, at a temperature of 22° C. with material ablation of 0.02 μm Rinsing with ultrapure water (e.g., 18 MΩ) for 5 minutes at 22° C.

Main cleaning by means of $HF/HNO_3$, e.g.: etching for 2 min at 8° C. in $HF/HNO_3$ with 6 weight % HF, 55 weight % $HNO_3$, and 1 weight % Si; etch ablation: about 30 μm Rinsing with ultrapure water, e.g., with ultrapure water with 18 MΩ at 22° C., for 5 min Hydrophilization with ozone water, e.g., for 5 min in water at 22° C. which is saturated with 20 ppm ozone Drying with ultrapure air, e.g., 60 min drying with ultrapure air of class 100 at 80° C.

Cooling with ultrapure air, e.g., to 22° C.

In the course of drying and in the course of cooling, the air is preferably purified by means of boron-free PTFE filters.

The cleaned polysilicon chunks are subsequently packed into a PE pouch. Used preferably for this purpose it a low-dopant PE glove.

All of the plastics used have a boron, phosphorus, and arsenic content of less than 10 ppbw.

The mineral acids used, HCl, HF, and $HNO_3$, may contain at most

| | |
|---|---|
| B | 10 ppbw; |
| P | 500 ppbw; |
| As | 50 ppbw. |

It has emerged that with a spiked roll as per the first method of the invention, a higher durability can be achieved; it is consistently possible to comminute more than 1000 metric tons of silicon before individual teeth break off from the spiked roll.

Elucidated in detail below is a preferred embodiment of the second method of the invention.

A polysilicon rod is comminuted with comminuting machines based on nonbrittle steel grades soluble in mineral acids and having a W fraction of between 1% to 25%.

The nonbrittle steel alloy allows the use of spiked rolls and hence the production of a cubic polychunk.

A polychunk produced in this way has an iron and tungsten entry level of less than 10 ppbw.

The procedure for cleaning is preferably as follows:

The preliminary cleaning and the main cleaning take place in separate acid circuits Preliminary cleaning in HF, HCl, and $H_2O_2$, e.g., for 5 minutes in a mixture of HF 5 weight %, HCl 8 weight %, $H_2O_2$ 3 weight %, at a temperature of 22° C. with material ablation of 0.02 μm Rinsing with ultrapure water (e.g., 18 MΩ) for 5 minutes at 22° C.

Main cleaning by means of $HF/HNO_3$, e.g.: etching for 2 min at 8° C. in $HF/HNO_3$ with 6 weight % HF, 55 weight % $HNO_3$, and 1 weight % Si; etch ablation: about 30 μm Rinsing with ultrapure water, e.g., with ultrapure water with 18 MΩ at 22° C., for 5 min Hydrophilization with ozone water, e.g., for 5 min in water at 22° C. which is saturated with 20 ppm ozone Drying with ultrapure air, e.g., 60 min drying with ultrapure air of class 100 at 80° C.

Cooling with ultrapure air, e.g., to 22° C.

In the course of drying and in the course of cooling, the air is preferably purified by means of boron-free PTFE filters.

The cleaned polysilicon chunks are subsequently packed into a PE pouch. Used preferably for this purpose is a low-dopant PE glove.

All of the plastics used have a boron, phosphorus, and arsenic content of less than 10 ppbw.

The mineral acids used, HCl, HF, and $HNO_3$, may contain at most

| | |
|---|---|
| B | 10 ppbw; |
| P | 500 ppbw; |
| As | 50 ppbw. |

In another preferred embodiment of the second method of the invention, cleaning is modified as follows:

The preliminary cleaning and the main cleaning take place in separate acid circuits Preliminary cleaning in NaOH or KOH, e.g., for 3 minutes in a mixture of 20 weight % NaOH or KOH, at a temperature of 60° C. with material ablation of 0.02 μm Rinsing with ultrapure water (e.g., 18 MΩ) for 5 minutes at 22° C.

Main cleaning by means of $HF/HNO_3$, e.g.: etching for 3 min at 8° C. in $HF/HNO_3$ with 6 weight % HF, 55 weight % $HNO_3$, and 1 weight % Si; etch ablation: about 30 μm Rinsing with ultrapure water, e.g., with ultrapure water with 18 MΩ at 22° C., for 5 min Hydrophilization with ozone water, e.g., for 5 min in water at 22° C. which is saturated with 20 ppm ozone Drying with ultrapure air, e.g., 60 min drying with ultrapure air of class 100 at 80° C.

Cooling with ultrapure air, e.g., to 22° C.

In the course of drying and in the course of cooling, the air is preferably purified by means of boron-free PTFE filters.

The cleaned polysilicon chunks are subsequently packed into a PE pouch. Used preferably for this purpose it a low-dopant PE glove.

All of the plastics used have a boron, phosphorus, and arsenic content of less than 10 ppbw.

The mineral acids used, HCl, HF, and $HNO_3$, may contain at most

| | |
|---|---|
| B | 10 ppbw; |
| P | 500 ppbw; |
| As | 50 ppbw. |

With the second method of the invention it has emerged that an even longer durability is achieved for the spiked rolls. With a spiked roll of this kind it is possible to comminute at least 5000 metric tons of silicon, and this makes the second method of the invention particularly economic.

With both methods of the invention and with the described embodiments of the two methods, it is preferably ensured that the crusher is located in a cleanroom of class less than or equal to 10000.

The unit is preferably located in a cleanroom of class 100 or better (according to US FED STD 209E, superseded by ISO 14644-1).

With class 100 (ISO 5), there must be not more than 3.5 particles with a diameter of not more than 0.5 µm present per liter.

In the cleanroom it is preferred to use exclusively cleanroom filters having a PTFE membrane.

The construction of the cleanroom filter ought to be as follows:

It comprises a nondeformable frame which emits few particles, preferably made of wood, such as plywood, or of aluminum.

The filter further comprises a support fabric consisting of three layers. A top layer and a bottom layer consist of PE+PET. The middle layer is of PTFE.

It should be ensured that the auxiliaries (including the adhesive, casting compounds, frame parts, support fabric, and PTFE membrane) used in the filter contain less than 10 ppbw boron, less than 10 ppbw phosphorus, and less than 10 ppbw arsenic.

The support fabric is preferably bonded adhesively to the frame.

The adhesive is preferably polyvinyl acetate.

In the cleanroom there is preferably an ionization system implemented in order to neutralize electrostatic charges by means of active air ionization. Ionizers flood the cleanroom air with ions in such a way that static charges on insulators and ungrounded conductors are broken down.

For the lining of metal parts on the crusher, at least one plastic is used that is selected from one or more elements from the group consisting of polypropylene, polyethylene, PU, and PVDF, with the lining of the crusher containing less than 100 ppbw boron, less than 100 ppbw phosphorus, and less than 10 ppbw arsenic.

Following comminution, the crushed silicon is classified into chunk sizes by means—preferably—of a mechanical screen, the mechanical screen being lined with plastic or with silicon. The plastic used contains less than 10 ppbw of B, P, and As. The plastic used here is selected from one or more elements from the group consisting of polypropylene, polyethylene, PU, and polyvinylidene fluoride (PVDF).

The cleaning unit is preferably located in a cleanroom of class less than or equal to 10000, preferably in a cleanroom of class 100 or better.

The cleanroom uses exclusively cleanroom filters with a PTFE membrane.

For the lining of etching tanks and pipelines, it is preferred to use at least one plastic selected from one or more elements from the group consisting of polypropylene, polyethylene, PU, and PVDF, that contains less than 100 ppbw boron, also less than 100 ppbw phosphorus, and preferably also less than 10 ppbw arsenic.

With regard to the acids used in the cleaning process, such as HF, HCl, and $HNO_3$, for example, it should be ensured that they contain less than 10 ppbw boron and also less than 500 ppbw phosphorus.

The acids preferably contain less than 50 ppbw arsenic.

To ensure the use of low-dopant acids, the dopant contents of the acids from preliminary and main cleaning and hydrophilization are monitored in this respect. For this purpose, before each of the cleaning operations, the boron, phosphorus, and arsenic contents are verified. If the values quoted above are exceeded, the acids are replaced or fresh acid is metered into the cleaning tanks in order to ensure that less than 10 ppbw boron and less than 500 ppbw phosphorus are present in the acids.

During the comminution of the polychunk, the following protective clothing is preferably worn:

a.) protective goggles to counter Si splinters (eye protection)

b.) a jacket to protect the abdomen and throat area, consisting of a puncture-resistant and cut-resistant fabric made, for example, from Keflar® with Dyneema® or steel fibers ("Keflar" is a protected trademark of DuPont, "Dyneema" is a protected trademark of DSM)

c.) to protect against puncture and cut injuries, corresponding gloves are worn, such as a combination of a puncture- and cut-resistant underglove (preferably PU Dyneema® or Keflar® with steel wires) and an overglove, e.g., a combined cotton/polyester glove with colored or noncolored cotton fiber inside and a polyester fiber outside.

EXAMPLES

Example 1

In a preliminary test, a WC piece weighing 0.5 g and with cobalt binder 10% ($W_2C$ phase or WC phase with 3% nickel carbide or 5% chromium carbide) was placed for 10 minutes in an $HF/HNO_3$ mixture with 6 weight % HF, 55 weight % $HNO_3$, and 1 weight % Si. After the 10 minutes, the piece has dissolved completely.

This shows that the $W_2C$ phases used dissolve very well even in mineral acids, which is essential for the method of the invention.

A rod weighing 100 kg was comminuted using a spiked roll made from WC soluble in mineral acids. A WC with 10% Co and 5% chromium carbide was used.

Ten polychunks weighing 100 g were cleaned by the following process in a processing tray:

1. Preliminary cleaning in pickle by soaking as follows:
2 min cleaning in a mixture of HF 5 weight %, HCl 8 weight %, and $H_2O_2$ 3 weight % at a temperature of 22° C.
The ablation was 0.02 µm.

2. Rinsing with ultrapure water 18 MΩ for 5 minutes at 22° C.

3. Main cleaning: etching for 2 min at 8° C. in $HF/HNO_3$ with 6 weight % HF, 55 weight % $HNO_3$, and 1 weight % Si
The etch ablation was about 30 µm.

4. 5 min rinsing with ultrapure water at 22° C. with 18 MΩ

5. 2 min hydrophilization in water at 22° C., saturated with 20 ppm ozone.

6. 60 min drying with ultrapure air of class 100 at 80° C. with boron-free Teflon filter 7. Cooling with ultrapure air at 22° C. with boron-free Teflon filter The polycrystalline silicon chunks were subsequently packed into PE pouches, using PE gloves.

All of the plastics used had a boron, phosphorus, and arsenic content in total of less than 10 ppbw.

The mineral acids used, HCl, HF, and nitric acids, contained in each case not more than

| B | 10 ppbw; |
| P | 500 ppbw; |
| As | 50 ppbw |

Table 1 shows metal surface values prior to cleaning (entry values); amounts in pptw.

Table 2 shows metal values after cleaning; amounts in pptw

It emerges that all of the metal values, including tungsten, are lowered significantly on cleaning. This could only be brought about by carrying out comminution using rolls with tungsten carbide or tungsten soluble in mineral acids.

Example 2

In a preliminary test, a steel piece weighing 0.5 g and with a tungsten content of 15 weight % (Bohler steel) was placed for 10 minutes in an HF/HNOh mixture with 6 weight % HF, 55 weight % $HNO_3$, and 1 weight % Si. After the 10 minutes, the piece had dissolved completely.

A rod weighing 100 kg was comminuted using a spiked roll made from a steel grade soluble in mineral acids and containing 15 weight % W.

Ten polychunks weighing 100 g were cleaned by the following process in a processing tray:

1. Preliminary cleaning in pickle 2 min cleaning in a mixture of HF 5 weight %, HCl 8 weight %, and $H_2O_2$ 3 weight % at a temperature of 22° C.

The ablation was 0.02 μm.

2. Rinsing with ultrapure water 18 MΩ for 5 minutes at 22° C.

3. Main cleaning: etching for 2 min at 8° C. in HF/$HNO_3$ with 6 weight % HF, 55 weight % $HNO_3$, and 1 weight % Si The etch ablation was about 30 μm.

4. 5 min rinsing with ultrapure water at 22° C. with 18 MΩ

5. 2 min hydrophilization in water at 22° C., saturated with 20 ppm ozone.

6. 60 min drying with ultrapure air of class 100 at 80° C. with boron-free Teflon filter 7. Cooling with ultrapure air at 22° C. with boron-free Teflon filter The polycrystalline silicon chunks were subsequently packed into PE pouches, using PE gloves.

All of the plastics used had a boron, phosphorus, and arsenic content in total of less than 10 ppbw.

The mineral acids used, HCl, HF, and nitric acids, contained in each case not more than

| B | 10 ppbw; |
| P | 500 ppbw; |
| As | 50 ppbw |

Table 3 shows metal surface values prior to cleaning (entry values); amounts in pptw.

Table 4 shows metal values after cleaning; amounts in pptw

It emerges that all of the metal values, including tungsten, are lowered significantly on cleaning. This could only be brought about by carrying out comminution using rolls with tungsten carbide or tungsten soluble in mineral acids.

Example 3

In a preliminary test, a steel piece weighing 0.5 g and with a tungsten content of 10 weight % (Bohler steel) was placed for 10 minutes in a 20 weight % aqueous potassium hydroxide solution at a temperature of 60 degrees. After the 10 minutes, the piece had dissolved completely.

A rod weighing 100 kg was comminuted using a spiked roll made from a steel grade soluble in alkaline media and containing 10 weight % W.

Ten polychunks weighing 100 g were cleaned by the following process in a processing tray:

1. Preliminary cleaning in aqueous potassium hydroxide solution 2 min cleaning in a mixture of 20 weight % KOH at a temperature of 60° C.

Ablation: 2 μm

2. Rinsing with ultrapure water 18 MΩ for 5 minutes at 22° C.

3. Main cleaning: etching for 5 min at 8° C. in HF/$HNO_3$ with 6 weight % HF, 55 weight % $HNO_3$, and 1 weight % Si Etch ablation: about 30 μm.

4. 5 min rinsing with ultrapure water at 22° C. with 18 MΩ.

5. 2 min hydrophilization in water at 22° C., saturated with 20 ppm ozone.

6. 60 min drying with ultrapure air of class 100 at 80° C. with boron-free Teflon filter 7. Cooling with ultrapure air at 22° C. with boron-free Teflon filter The polycrystalline silicon chunks were subsequently packed into PE pouches, using PE gloves.

All of the plastics used had a boron, phosphorus, and arsenic content in total of less than 10 ppbw.

The mineral acids used, HCl, HF, and nitric acids, contained in each case not more than

| B | 10 ppbw; |
| P | 500 ppbw; |
| As | 50 ppbw |

Table 5 shows metal surface values prior to cleaning (entry values); amounts in pptw.

Table 6 shows metal values after cleaning; amounts in pptw.

It emerges that all of the metal values, including tungsten, are lowered significantly on cleaning. This could only be brought about by carrying out comminution using rolls with tungsten carbide or tungsten soluble in alkaline media.

Table 7 shows dopant concentrations on the surface of the polysilicon chunks comminuted and cleaned in accordance with examples 1 to 3. Of the 10 chunks cleaned in each case, 5 were analyzed for dopants in each case.

Samples #1-#5 correspond to example 1, samples #6-#10 to example 2, and samples #11-#15 to example 3.

TABLE 7

|  | B in ppta | P in ppta | As in ppta |
|---|---|---|---|
| #1 | 13 | 1 | 2 |
| #2 | 18 | 3 | 3 |
| #3 | 17 | 7 | <0.1 |
| #4 | 16 | 5 | 0.2 |
| #5 | 3 | 6 | <0.1 |
| #6 | 3 | 8 | 5 |
| #7 | 12 | 8 | 2 |
| #8 | 7 | 9 | <0.1 |
| #9 | 5 | 16 | 3 |
| #10 | 17 | 4 | 3 |
| #11 | 14 | 8 | 2 |
| #12 | 7 | 14 | 5 |
| #13 | 2 | <1 | <0.1 |
| #14 | 3 | 3 | 1 |
| #15 | 2 | 14 | 3 |

Table 8 shows a comparison of the specific unit costs per annual metric ton of polysilicon.

TABLE 8

| Method | Costs/euros |
|---|---|
| State of the art US 2010/0001106 A1 | 2000 |
| Route 1 spiked roll with $W_2C$ phase Preliminary cleaning with mineral acids | 1500 |
| Route 2 spiked roll of steel with 15% W Preliminary cleaning with mineral acids | 1600 |
| Route 3 spiked roll of steel with 10% W Alkaline preliminary cleaning | 1300 |

Table 9 shows a comparison of the specific acid costs per kg of polysilicon.

TABLE 9

| Method | Costs/euros |
|---|---|
| State of the art US 2010/0001106 A1 | 0.45 |
| Route 1 spiked roll with $W_2C$ phase Preliminary cleaning with mineral acids | 0.3 |
| Route 2 spiked roll of steel with 15% W Preliminary cleaning with mineral acids | 0.33 |
| Route 3 spiked roll of steel with 10% W Alkaline preliminary cleaning | 0.24 |

The use of spiked rolls containing tungsten carbide for comminution and subsequent alkaline preliminary cleaning is therefore especially preferred.

Table 10 shows a comparison of the specific materials costs for the acquisition of spiked rolls per annular metric ton of polysilicon.

TABLE 10

| Method | Costs in euros |
|---|---|
| Steel rolls (US 2010/0001106 A1) | 20 |
| Rolls of brittle, acid-insoluble WC grades (U.S. Pat. No. 7,270,706 B2) | 2500 |
| Rolls of nonbrittle, acid-soluble WC grades ($W_2C$) | 250 |
| Steel rolls with 1-25% W | 20 |

The costs for the rolls in accordance with the second method of the invention are equally favorable, in terms of acquisition, to those for pure steel rolls. The rolls with the nonbrittle WC grades ($W_2C$ or WC with additions) are significantly more favorable than rolls made from brittle WC (without additions or comprising $W_2C$ phases).

TABLE 1

| | For example 1, metal contaminations prior to cleaning, figures in pptw | | | | | | | | | | | | | | | | |
|---|---|---|---|---|---|---|---|---|---|---|---|---|---|---|---|---|---|
| | Fe | Cr | Ni | Na | Zn | Al | Cu | Mo | Ti | W | K | Co | Mn | Ca | Mg | V | Ag |
| | 2000 | 20 | 1 | 185 | 145 | 88 | 1 | 0 | 210 | 6000 | 188 | 45 | 0 | 210 | 45 | 0 | 0 |
| | 2500 | 15 | 0 | 155 | 122 | 120 | 0 | 0 | 220 | 5000 | 123 | 55 | 0 | 156 | 56 | 2 | 2 |
| | 1200 | 10 | 1 | 135 | 166 | 134 | 1 | 1 | 190 | 5550 | 134 | 67 | 1 | 145 | 67 | 3 | 0 |
| | 800 | 5 | 2 | 210 | 177 | 187 | 0 | 0 | 234 | 4976 | 165 | 110 | 0 | 122 | 23 | 1 | 0 |
| | 5000 | 23 | 0 | 110 | 123 | 145 | 2 | 0 | 250 | 7230 | 210 | 56 | 2 | 234 | 45 | 1 | 2 |
| | 4350 | 22 | 1 | 165 | 169 | 110 | 1 | 0 | 123 | 8250 | 67 | 134 | 1 | 125 | 21 | 2 | 0 |
| | 1240 | 17 | 2 | 235 | 135 | 89 | 1 | 0 | 210 | 2100 | 145 | 120 | 1 | 210 | 48 | 3 | 1 |
| | 6700 | 19 | 3 | 189 | 189 | 210 | 3 | 0 | 230 | 3500 | 167 | 89 | 0 | 267 | 66 | 1 | 2 |
| 25% quantile | 1230 | 14 | 1 | 129 | 132 | 105 | 1 | 0 | 205 | 4532 | 131 | 56 | 0 | 140 | 40 | 1 | 0 |
| Median | 2250 | 18 | 1 | 160 | 156 | 127 | 1 | 0 | 215 | 5275 | 155 | 78 | 1 | 183 | 47 | 2 | 1 |
| Mean | 2974 | 16 | 1 | 163 | 153 | 135 | 1 | 0 | 208 | 5313 | 150 | 85 | 1 | 184 | 46 | 2 | 1 |
| 75% quantile | 4513 | 21 | 2 | 191 | 171 | 156 | 1 | 0 | 231 | 6308 | 172 | 113 | 1 | 216 | 59 | 2 | 2 |

TABLE 2

| For example 1, metal contaminations after cleaning, figures in pptw | | | | | | | | | | | | | | | | | |
|---|---|---|---|---|---|---|---|---|---|---|---|---|---|---|---|---|---|
| Fe | Cr | Ni | Na | Zn | Al | Cu | Mo | Ti | W | K | Co | Mn | Ca | Mg | V | Ag |
| 20 | 2 | 1 | 2 | 0 | 1 | 1 | 0 | 12 | 1 | 1 | 0 | 0 | 12 | 0 | 0 | 0 |
| 5 | 1 | 0 | 4 | 1 | 3 | 0 | 0 | 15 | 2 | 3 | 1 | 0 | 9 | 1 | 0 | 0 |
| 2 | 0 | 1 | 7 | 3 | 2 | 1 | 1 | 5 | 0 | 1 | 2 | 1 | 3 | 1 | 1 | 0 |
| 12 | 1 | 2 | 1 | 2 | 1 | 0 | 0 | 2 | 0 | 2 | 1 | 0 | 12 | 2 | 0 | 0 |
| 9 | 2 | 0 | 3 | 1 | 0 | 2 | 0 | 5 | 1 | 1 | 0 | 2 | 6 | 0 | 0 | 0 |
| 7 | 0 | 1 | 4 | 2 | 1 | 1 | 0 | 9 | 2 | 3 | 1 | 1 | 3 | 1 | 10 | |
| 4 | 1 | 2 | 2 | 1 | 2 | 1 | 0 | 12 | 2 | 0 | 0 | 1 | 1 | 2 | 0 | 0 |
| 9 | 2 | 3 | 1 | 2 | 1 | 3 | 0 | 14 | 1 | 1 | 1 | 0 | 2 | 1 | 1 | 2 |

TABLE 2-continued

For example 1, metal contaminations after cleaning, figures in pptw

|  | Fe | Cr | Ni | Na | Zn | Al | Cu | Mo | Ti | W | K | Co | Mn | Ca | Mg | V | Ag |
|---|---|---|---|---|---|---|---|---|---|---|---|---|---|---|---|---|---|
| 25% quantile | 5 | 1 | 1 | 2 | 1 | 1 | 1 | 0 | 5 | 1 | 1 | 0 | 0 | 3 | 1 | 0 | 0 |
| Median | 8 | 1 | 1 | 3 | 2 | 1 | 1 | 0 | 11 | 1 | 1 | 1 | 1 | 5 | 1 | 0 | 0 |
| Mean | 9 | 1 | 1 | 3 | 2 | 1 | 1 | 0 | 9 | 1 | 2 | 1 | 1 | 6 | 1 | 0 | 0 |
| 75% quantile | 10 | 2 | 2 | 4 | 2 | 2 | 1 | 0 | 13 | 2 | 2 | 1 | 1 | 10 | 1 | 1 | 0 |

TABLE 3

For example 2, metal contaminations prior to cleaning, figures in pptw

|  | Fe | Cr | Ni | Na | Zn | Al | Cu | Mo | Ti | W | K | Co | Mn | Ca | Mg | V | Ag |
|---|---|---|---|---|---|---|---|---|---|---|---|---|---|---|---|---|---|
|  | 800 | 20 | 2 | 185 | 145 | 88 | 3 | 1 | 210 | 499 | 188 | 15 | 2 | 210 | 45 | 0 | 0 |
|  | 7500 | 15 | 4 | 155 | 122 | 120 | 4 | 2 | 220 | 323 | 123 | 23 | 4 | 156 | 56 | 2 | 2 |
|  | 9500 | 10 | 5 | 135 | 166 | 134 | 2 | 1 | 190 | 750 | 134 | 25 | 2 | 146 | 67 | 3 | 0 |
|  | 6000 | 5 | 2 | 210 | 177 | 187 | 6 | 0 | 234 | 230 | 165 | 11 | 0 | 122 | 23 | 1 | 0 |
|  | 7000 | 23 | 1 | 110 | 123 | 145 | 4 | 2 | 250 | 340 | 210 | 50 | 1 | 234 | 45 | 1 | 2 |
|  | 8850 | 22 | 5 | 165 | 169 | 110 | 2 | 0 | 123 | 710 | 67 | 13 | 5 | 125 | 21 | 2 | 0 |
|  | 7550 | 17 | 2 | 235 | 135 | 89 | 1 | 3 | 210 | 145 | 145 | 12 | 0 | 210 | 48 | 3 | 1 |
|  | 6700 | 19 | 3 | 110 | 189 | 210 | 3 | 0 | 230 | 167 | 167 | 14 | 1 | 267 | 66 | 1 | 2 |
| 25% quantile | 6625 | 14 | 2 | 129 | 132 | 105 | 2 | 0 | 205 | 131 | 131 | 13 | 1 | 140 | 40 | 1 | 0 |
| Median | 7250 | 18 | 3 | 160 | 156 | 127 | 3 | 1 | 215 | 155 | 156 | 15 | 2 | 183 | 47 | 2 | 1 |
| Mean | 6738 | 16 | 3 | 163 | 153 | 135 | 3 | 1 | 208 | 150 | 150 | 20 | 2 | 184 | 46 | 2 | 1 |
| 75% quantile | 7875 | 21 | 4 | 191 | 171 | 156 | 4 | 2 | 231 | 172 | 172 | 24 | 3 | 216 | 59 | 2 | 2 |

TABLE 4

For example 2, metal contaminations after cleaning, figures in pptw

|  | Fe | Cr | Ni | Na | Zn | Al | Cu | Mo | Ti | W | K | Co | Mn | Ca | Mg | V | Ag |
|---|---|---|---|---|---|---|---|---|---|---|---|---|---|---|---|---|---|
|  | 12 | 2 | 1 | 2 | 0 | 1 | 1 | 0 | 12 | 1 | 1 | 0 | 0 | 12 | 0 | 0 | 0 |
|  | 3 | 1 | 0 | 4 | 1 | 3 | 0 | 0 | 15 | 2 | 3 | 1 | 0 | 9 | 1 | 0 | 0 |
|  | 2 | 0 | 1 | 7 | 3 | 2 | 1 | 1 | 5 | 0 | 1 | 2 | 1 | 3 | 1 | 1 | 0 |
|  | 9 | 1 | 2 | 1 | 2 | 1 | 0 | 0 | 2 | 0 | 2 | 0 | 0 | 12 | 2 | 0 | 0 |
|  | 8 | 2 | 0 | 3 | 1 | 0 | 2 | 0 | 5 | 1 | 1 | 0 | 2 | 6 | 0 | 0 | 0 |
|  | 6 | 0 | 1 | 4 | 2 | 1 | 1 | 0 | 9 | 2 | 3 | 1 | 1 | 3 | 1 | 1 | 0 |
|  | 4 | 1 | 2 | 2 | 1 | 2 | 1 | 0 | 12 | 2 | 0 | 0 | 1 | 1 | 2 | 0 | 0 |
|  | 9 | 2 | 3 | 1 | 2 | 1 | 3 | 0 | 14 | 1 | 1 | 1 | 0 | 2 | 1 | 1 | 2 |
| 25% quantile | 4 | 1 | 1 | 2 | 1 | 1 | 1 | 0 | 5 | 1 | 1 | 0 | 0 | 3 | 1 | 0 | 0 |
| Median | 7 | 1 | 1 | 3 | 2 | 1 | 1 | 0 | 11 | 1 | 1 | 1 | 1 | 5 | 1 | 0 | 0 |
| Mean | 7 | 1 | 1 | 3 | 2 | 1 | 1 | 0 | 9 | 1 | 2 | 1 | 1 | 6 | 1 | 0 | 0 |
| 75% quantile | 9 | 2 | 2 | 4 | 2 | 2 | 1 | 0 | 13 | 2 | 2 | 1 | 1 | 10 | 1 | 1 | 0 |

TABLE 5

For example 3, metal contaminations prior to cleaning, figures in pptw

|  | Fe | Cr | Ni | Na | Zn | Al | Cu | Mo | Ti | W | K | Co | Mn | Ca | Mg | V |
|---|---|---|---|---|---|---|---|---|---|---|---|---|---|---|---|---|
|  | 9000 | 20 | 2 | 185 | 145 | 88 | 3 | 1 | 210 | 400 | 188 | 15 | 2 | 210 | 45 | 0 |
|  | 8550 | 15 | 4 | 155 | 122 | 120 | 4 | 2 | 220 | 250 | 123 | 12 | 4 | 156 | 56 | 2 |
|  | 4550 | 10 | 5 | 135 | 166 | 134 | 2 | 1 | 190 | 450 | 134 | 24 | 2 | 145 | 67 | 3 |
|  | 2300 | 5 | 2 | 210 | 177 | 187 | 6 | 0 | 234 | 350 | 165 | 45 | 0 | 122 | 23 | 1 |
|  | 6700 | 23 | 1 | 110 | 123 | 145 | 4 | 2 | 250 | 340 | 210 | 55 | 1 | 234 | 45 | 1 |
|  | 4502 | 22 | 5 | 165 | 169 | 110 | 2 | 0 | 123 | 125 | 67 | 9 | 5 | 125 | 21 | 2 |
|  | 4360 | 17 | 2 | 235 | 135 | 89 | 1 | 3 | 210 | 465 | 145 | 13 | 0 | 210 | 48 | 3 |
|  | 6700 | 19 | 3 | 110 | 189 | 210 | 3 | 0 | 230 | 365 | 167 | 34 | 1 | 267 | 66 | 1 |
| 25% quantile | 4467 | 14 | 2 | 129 | 132 | 105 | 2 | 0 | 205 | 318 | 131 | 13 | 1 | 140 | 40 | 1 |
| Median | 5625 | 18 | 3 | 160 | 156 | 127 | 3 | 1 | 215 | 363 | 156 | 20 | 2 | 183 | 47 | 2 |
| Mean | 5833 | 16 | 3 | 163 | 153 | 135 | 3 | 1 | 208 | 342 | 150 | 26 | 2 | 184 | 46 | 2 |
| 75% quantile | 7163 | 21 | 4 | 191 | 171 | 156 | 4 | 2 | 231 | 413 | 172 | 37 | 3 | 216 | 59 | 2 |

TABLE 6

For example 3, metal contaminations after cleaning, figures in pptw

|  | Fe | Cr | Ni | Na | Zn | Al | Cu | Mo | Ti | W | K | Co | Mn | Ca | Mg | V |
|---|---|---|---|---|---|---|---|---|---|---|---|---|---|---|---|---|
|  | 12 | 2 | 1 | 2 | 0 | 1 | 1 | 0 | 12 | 1 | 1 | 0 | 0 | 12 | 0 | 0 |
|  | 3 | 1 | 0 | 4 | 1 | 3 | 0 | 0 | 15 | 2 | 3 | 1 | 0 | 9 | 1 | 0 |
|  | 2 | 0 | 1 | 7 | 3 | 2 | 1 | 1 | 5 | 0 | 1 | 2 | 1 | 3 | 1 | 1 |
|  | 9 | 1 | 2 | 1 | 2 | 1 | 0 | 0 | 2 | 0 | 2 | 0 | 0 | 12 | 2 | 0 |
|  | 8 | 2 | 0 | 3 | 1 | 0 | 2 | 0 | 5 | 1 | 1 | 0 | 2 | 6 | 0 | 0 |
|  | 6 | 0 | 1 | 4 | 2 | 1 | 1 | 0 | 9 | 2 | 1 | 1 | 1 | 3 | 1 | 1 |
|  | 4 | 1 | 2 | 2 | 1 | 2 | 1 | 0 | 12 | 2 | 3 | 0 | 1 | 1 | 2 | 0 |
|  | 9 | 2 | 3 | 1 | 2 | 1 | 3 | 0 | 14 | 1 | 1 | 1 | 0 | 2 | 1 | 1 |
| 25% quantile | 4 | 1 | 1 | 2 | 1 | 1 | 1 | 0 | 5 | 1 | 1 | 0 | 0 | 3 | 1 | 0 |
| Median | 7 | 1 | 1 | 3 | 2 | 1 | 1 | 0 | 11 | 1 | 1 | 1 | 1 | 5 | 1 | 0 |
| Mean | 7 | 1 | 1 | 3 | 2 | 1 | 1 | 0 | 9 | 1 | 2 | 1 | 1 | 6 | 1 | 0 |
| 75% quantile | 9 | 2 | 2 | 4 | 2 | 2 | 1 | 0 | 13 | 2 | 2 | 1 | 1 | 10 | 1 | 1 |

What is claimed is:

1. A method for producing polycrystalline silicon chunks, comprising providing a polycrystalline silicon rod, comminuting the polycrystalline silicon rod into cubic chunks, and cleaning the polycrystalline silicon chunks, wherein comminution takes place using a spiked-roll crusher having at least one spiked roll, the at least one spiked roll comprising $W_2C$ phases.

2. The method as claimed in claim 1, wherein the at least one spiked roll further comprises cobalt in an amount from 0.1 wt. % to 20 wt. %.

3. The method as claimed in claim 1, wherein the cleaning of the polycrystalline silicon chunks comprises the following steps: (a) preliminary cleaning in HF, HCl, and $H_2O_2$; rinsing with ultrapure water; (b) main cleaning with $HF/HNO_3$ in an acid circuit separate from the preliminary cleaning; (c) rinsing with ultrapure water; (d) hydrophilization with ozone water; (e) drying with ultrapure air; and (f) cooling with ultrapure air.

* * * * *